United States Patent [19]

Mitarai et al.

[11] Patent Number: 5,009,590
[45] Date of Patent: Apr. 23, 1991

[54] METHOD AND APPARATUS FOR PREHEATING SEMICONDUCTOR CHIPS

[75] Inventors: Tadashi Mitarai; Makoto Kanda, both of Fukuoka, Japan

[73] Assignee: Mitsubishi Denki Kabushiki Kaisha, Japan

[21] Appl. No.: 466,866

[22] Filed: Jan. 18, 1990

[30] Foreign Application Priority Data

Jul. 24, 1989 [JP] Japan .................. 1-191977

[51] Int. Cl.⁵ .............. F27D 3/00; F27D 13/00
[52] U.S. Cl. ................................. 432/121; 432/5; 432/6; 432/11; 432/122; 432/239; 432/33
[58] Field of Search .......... 432/2, 5, 6, 11, 52, 432/121, 124, 152, 239, 242, 253, 122; 414/217; 228/6.2, 6.1

[56] References Cited

U.S. PATENT DOCUMENTS

| 4,102,481 | 7/1978 | Ollenbach | 228/6.1 |
| 4,531,909 | 7/1985 | Takeshita | 432/33 X |
| 4,778,382 | 10/1988 | Sakashita | 432/152 X |

Primary Examiner—Henry A. Bennet
Assistant Examiner—Christopher B. Kilner
Attorney, Agent, or Firm—Leydig, Voit & Mayer

[57] ABSTRACT

A plurality of semiconductor chips are sequentially mounted on a rotary table, heated on the rotary table for a predetermined time, and ejected from the rotary table. The semiconductor chips ejected from the rotary table are fed to a bonding apparatus. The semiconductor chips are heated while the rotary table is stationary and are held to the rotary table by a vacuum chuck. The position of a semiconductor chip is adjusted before the semiconductor chip is ejected from the rotary table.

8 Claims, 4 Drawing Sheets

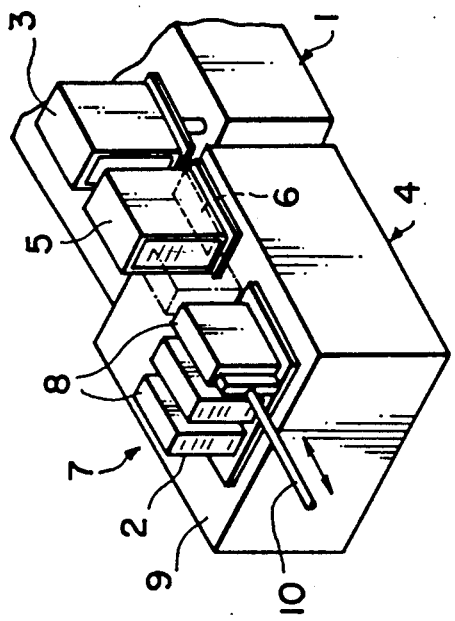
FIG. I
PRIOR ART
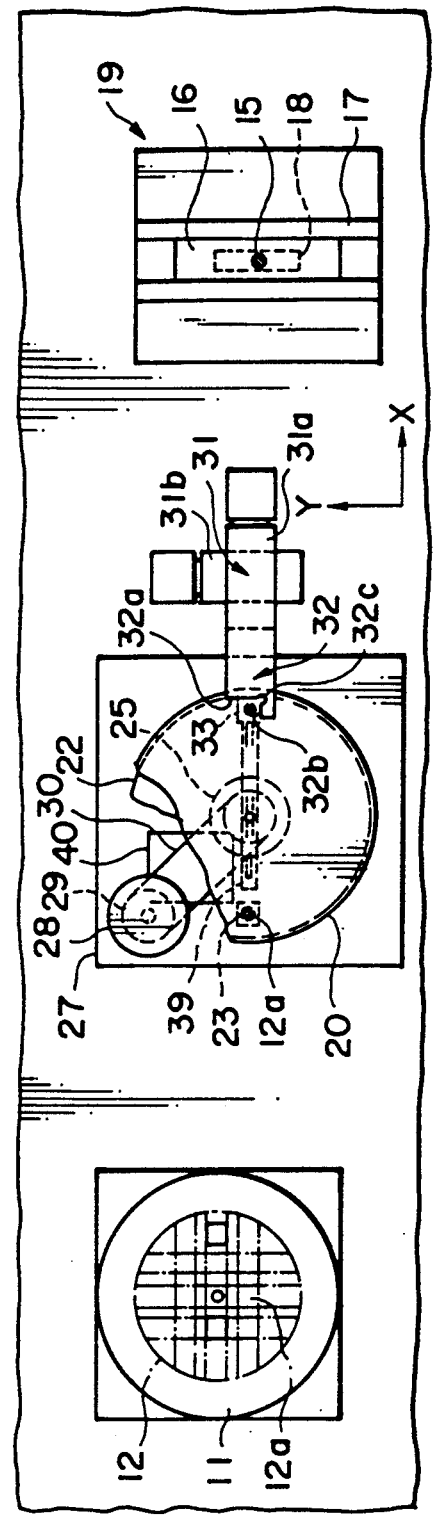
FIG. 2

METHOD AND APPARATUS FOR PREHEATING SEMICONDUCTOR CHIPS

BACKGROUND OF THE INVENTION

1. Field of the Invention

The present invention relates to a method and apparatus for preheating semiconductor chips before bonding them to a lead frame during the manufacture of semiconductor devices.

2. Description of the Related Art

FIG. 1 shows a perspective view of the bonding apparatus for a conventional method of preheating semiconductor devices disclosed in Japanese Published Patent Application 59-104137. In this figure, a bonding apparatus 1 bonds lead frames and semiconductor chips. A magazine 3 feeding lead frames and chips, i.e., the work 2, to a bonding position (not shown) is mounted on the upper side of the bonding apparatus 1. The magazine 3 is open at both ends, and a plurality of shelves for housing the work 2 are installed therein. A preheating apparatus 4 is installed adjacent the bonding apparatus 1 and preheats the work 2. A preheating magazine 5 is mounted on the upper side of the preheating apparatus 4 facing the opening of the magazine 3, is open at both ends, and has a heater 6 therein. A magazine charging mechanism 7 is installed adjacent the entrance side of the preheating magazine 5 and includes a plurality of magazines 8 so that the work 2 can be fed to the preheating magazine 5. The magazine charging mechanism 7 includes a moving mechanism 9 which moves at a right angle to align a magazine 8 with the feed magazine 3 so that the work 2 can be transferred to the preheating magazine 5. A work transfer mechanism 10 ejects the magazine 8 from the magazine charging mechanism 7 and is controlled so that the work 2 in the feed magazine 3 on the bonding apparatus 1 is ejected to the bonding position (not shown) when the preheating time in the preheating magazine 5 reaches a predetermined duration.

In FIG. 1, a driving part (not shown) drives the magazine charging mechanism 7 and moves a magazine 8 to the feed position. Then the magazine 8 is ejected and inserted into the preheating magazine 5 by the work transfer mechanism 10. The heating of the work 2 is started by turning on the electricity to the heater 6. The next magazine 8 is moved to the feeding position by the magazine charging mechanism 7 during heating of the first magazine. Next, after the heating of the work 2 at the heater 6 for a predetermined time, when the work transfer mechanism 10 is driven, the magazine 8 in the preheating magazine 5 is ejected by insertion of the next magazine and is inserted into the feed magazine 3 on the bonding apparatus 1. The aforementioned actions are repeated and the work 2 in the feed magazine 3 is fed to the bonding position (not shown) on the bonding apparatus 1 and bonded.

In the conventional preheating method for the semiconductor parts, a plurality of lead frames and chips in the magazine 8 heated by the preheating magazine 5 are fed to the bonding position from the next feed magazine 3. In the feed magazine 3, since the temperature of the work 2 housed at the downward part of the magazine 8 decreases, the work needs to be heated again at the bonding position. Therefore, there are the problems of not only reduced productivity but also reduced quality caused by movement of the chips relative to the lead frames during movement of the work 2.

SUMMARY OF THE INVENTION

This invention was created to solve the above-described problems. The purpose of this invention is to provide a preheating method and apparatus for heating a plurality of chips immediately before bonding and thereby preventing a decrease in temperature and for accurately bonding chips by adjusting for the movement of the chips during ejection of the magazine.

In order to achieve the above objects, according to one aspect of the present invention, there is provided a preheating method for the semiconductor chips comprising sequentially mounting a plurality of chips on a rotary table, heating the semiconductor chips on the rotary table for a predetermined time, and sequentially ejecting the heated semiconductor chips from the rotary table.

According to another aspect of the present invention, there is provided a preheating apparatus for the semiconductor chips comprising a rotary table, a primary driving means for rotating the rotary table, a feeding means for feeding the semiconductor chips to the rotary table, a heating means for heating the semiconductor chips on the rotary table, a secondary driving means for driving the heating means to intermittently make contact with the rotary table so that the semiconductor chips are heated when the rotary table is not rotated, and an ejecting means for ejecting the heated semiconductor chips from the rotary table.

BRIEF DESCRIPTION OF THE DRAWINGS

FIG. 1 shows a perspective view of a conventional bonding apparatus;

FIGS. 2 and 3 show a partially sectional plan view and side view of a preheating apparatus for semiconductor chips according to the present invention, respectively;

DESCRIPTION OF THE PREFERRED EMBODIMENTS

Figure 3:
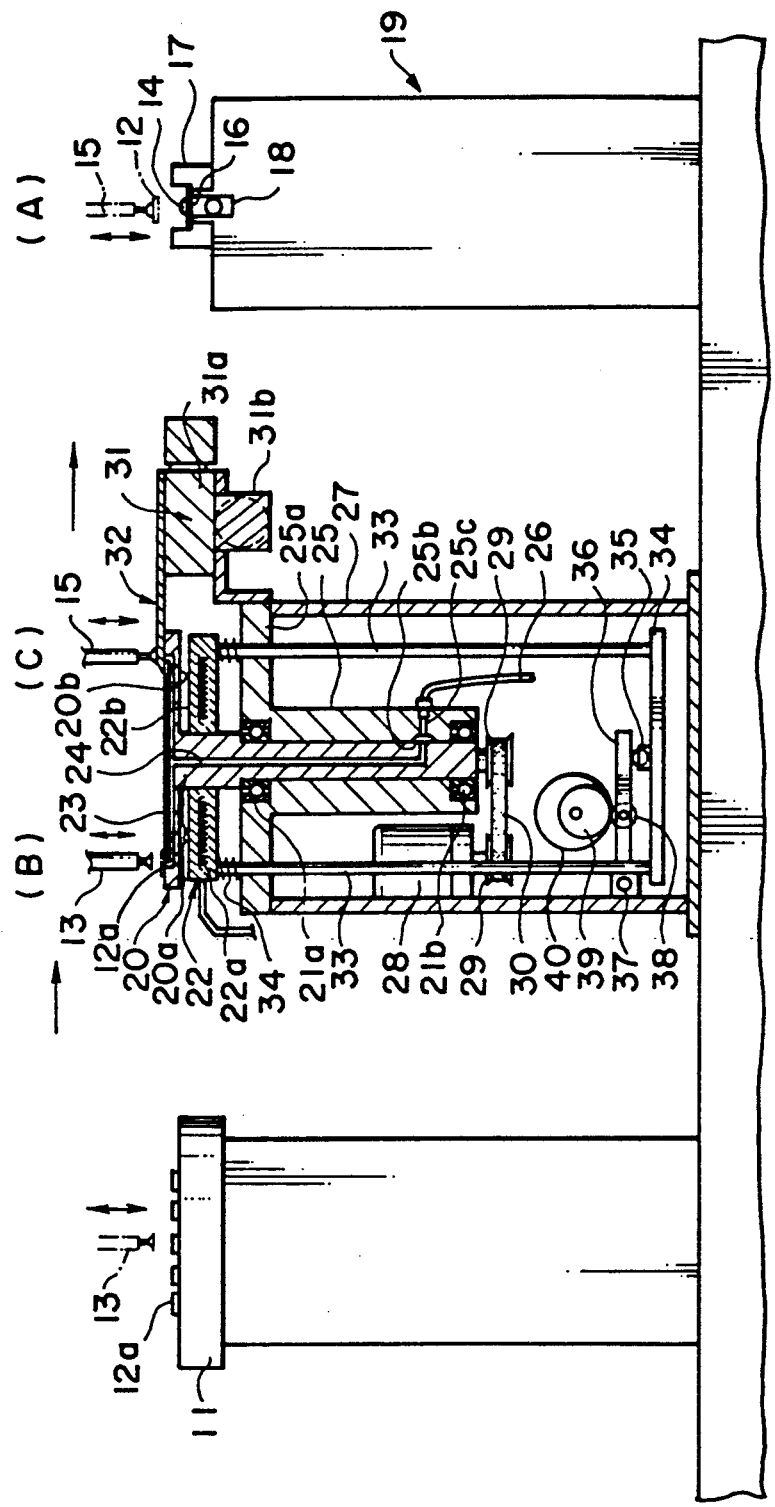

In FIGS. 2 and 3, a plurality of chips 12a cut from a semiconductor wafer 12 are mounted on the upper side of a table 11. A transfer head 13 positioned on top of the table 11 lifts the chips 12a from the table 11 by vacuum and transfers them to a feeding position B on a rotary table 20. This rotary table 20 can rotate 180 degrees when a chip 12a is mounted on the table 20 by the transfer head 13. The table is mounted on a rotating axle 20a that is exposed at one side. The axle is pivotally supported by rotary bearings 21a and 21b mounted at the upper and lower ends of the rotating axle 20a.

The upper side of the rotary table 20 is connected to the rotating axle 20a at the center of the table 20. A disc-shaped heat block 22 is mounted at the lower side 20b of the rotary table 20 and can freely contact or be separated from the lower side 20b. A heater 22a is mounted on the inside of the heat block 22. A U-shaped communicating hole 23 is formed at the center of the thickness of the rotary table 20 and parallel to the upper side of the table 20. First and second opposed ends of the hole 23 are respectively opened at a feeding position (B) and an ejecting position (C) of the rotary table 20. An L-shaped communicating hole 24 penetrates the center of the rotating axle 20a. One end of the hole 24 communicates with the communicating hole 23 and the other end is opened at the lower end of the rotating axle 20a. A bearing stand 25 is mounted opposite the lower part of the heat block 22 and the center part thereof is penetrated by the rotating axle 20a. Rotary bearings 21a and 21b are mounted on the upper and lower ends of the bearing stand 25, respectively. An annular channel 25b is formed at the internal circumference of the lower part of the bearing stand 25, communicates with the communicating hole 24 of the rotating axle 20a, and is connected to vacuum equipment (not shown) by a hose 26 through a communicating hole 25c.

The bearing stand 25 is fixed at the upper side of a frame 27 with an attaching bolt (not shown). A motor 28 fastened to the frame 27 is mounted on the side of the bearing stand 25 and rotates the rotary table 20 by means of a pulley 29 and a belt 30 attached to the motor 28 and the rotating axle 20a, respectively. A positioning unit 31 includes a motor 40 which exclusively drives a dedicated table, i.e., a positioning plate 32, in X and Y directions and is fastened with an attaching bolt (not shown) to the side of the bearing stand 25. The positioning unit 31 is driven by a controller (not shown) in which positioning dimensions are previously programmed according to the dimensions of the chip 12a.

The positioning plate 32 is fastened with an attaching bolt (not shown) at the upper face of an X-direction table 31a of the positioning unit 31. The lower face of the X-direction table 31a slightly rubs against the upper face of the rotary table 20. Positioning parts 32a and 32b for positioning a chip 12a are cut at a right angle and formed at the end of the positioning plate 32. An escapement 32c is formed at the point of intersection of the positioning parts 32a and 32b. One end of each of a pair of guiding rods 33 penetrates the plate part 25a of the bearing stand 25 and is fastened to the lower face of the heat block 22 with springs 34. The other ends of the guiding rods are connected to each other by a connecting rod 34.

A roller 35 is mounted on the center of the connecting rod 34. A lever 36 is mounted so that the lower face of one end rests on the upper face of the roller 35. The other end of the lever 36 is pivotally supported by a pivot 37. A roller 38 is mounted at about the center of the lever 36. A cam plate 39 is attached to the roller 38 and gives the lever 36 a rocking movement using the pivot 37 as the center. Another motor 40 is mounted on the lower part of the motor 28, fastened parallel to the inside of the frame 27, and attached to the cam plate 39.

The chip 12a transferred by the bonding head 15 is connected using solder 14. A lead frame 16 is mounted on the lower part of the bonding position (A), guided by a pair of rails 17 on both sides, and the solder 14 is applied on its upper side. A heat block 18 is mounted between the pair of rails 17 and heats the solder 14. Thus, the pair of rails 17 and the heat block 18 are mounted on the upper face of the bonding apparatus and the chip 12a is bonded on the lead frame 16.

Figure 4:
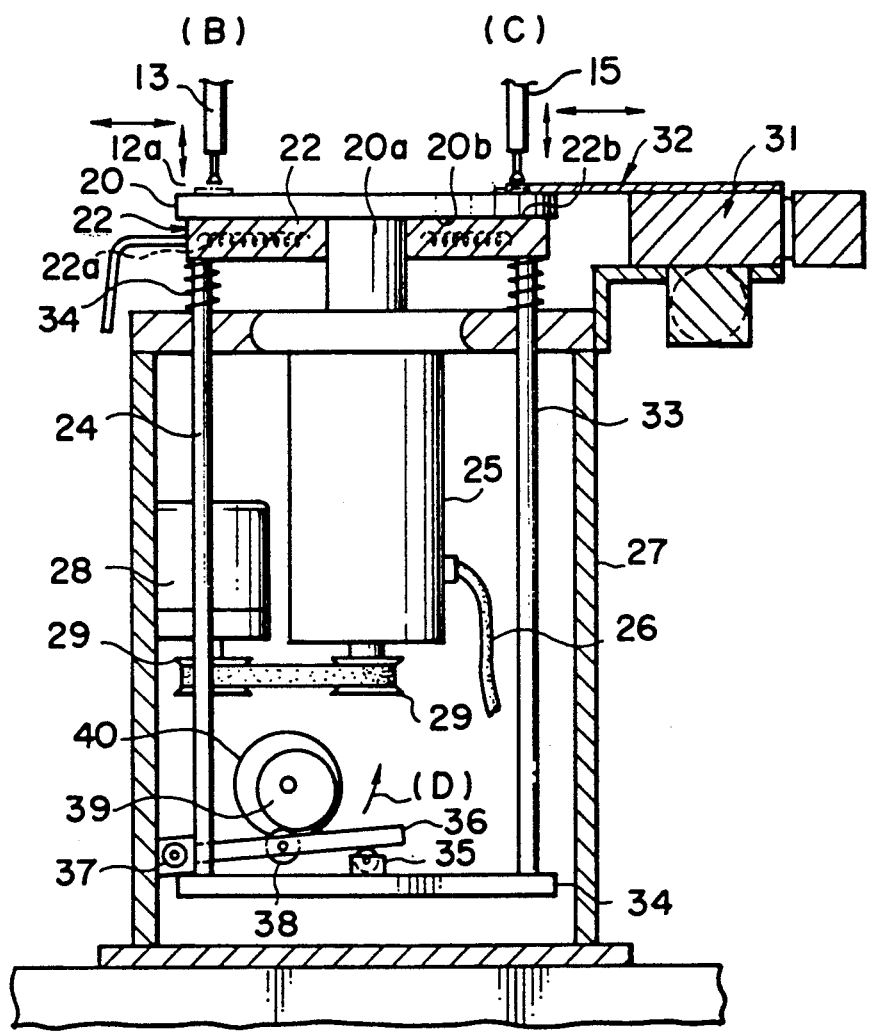
FIG. 4 shows an enlarged view of the principal part of the apparatus shown in FIG. 3.

In FIG. 4, a chip 12a is lifted and transferred by the transfer head 13 to the feeding point (B) of the rotary table 20. When operations are initiated, a heater 22a in the heat block 22 receives an electric current and heating of the whole rotary table 20 is started. At this time, the lower face 20b of the rotary table 20 is contacted by the upper face 22b of the heat block 22 and heat is transferred to the chip 12a through the rotary table 20.

When the motor 40 is driven, the cam plate 39 rotates in the arrow direction (D) and the cam plate 39 rolls on the roller 38 followed by an upward rocking movement of the lever 36 using the pivot 37 as the center. The guiding rod 33 is then raised by the expansion spring 34 through the roller 35 attached to the end of the lever 36. Conversely, when the motor 40 is driven in the reverse direction, since the major axis of the cam plate 39 pushes the roller 38 downward, as shown in FIG. 3, the guiding rod 33 is lowered and the spring 34 is compressed. The upper face 22b of the heat block 22 is hence separated from the lower face 20b of the rotary table 20.

Next, when the chip 12a on the rotary table 20 is heated for a predetermined time, the chip 12a is held down by the vacuum equipment (not shown) through the hose 26, the communicating hole 25c, the circular channel 25b, and the communicating holes 24 and 23. The chip 12a is, therefore, held to the upper face of the rotary table 20 to prevent any movement in response to the rotation of the table 20.

Figure 5:
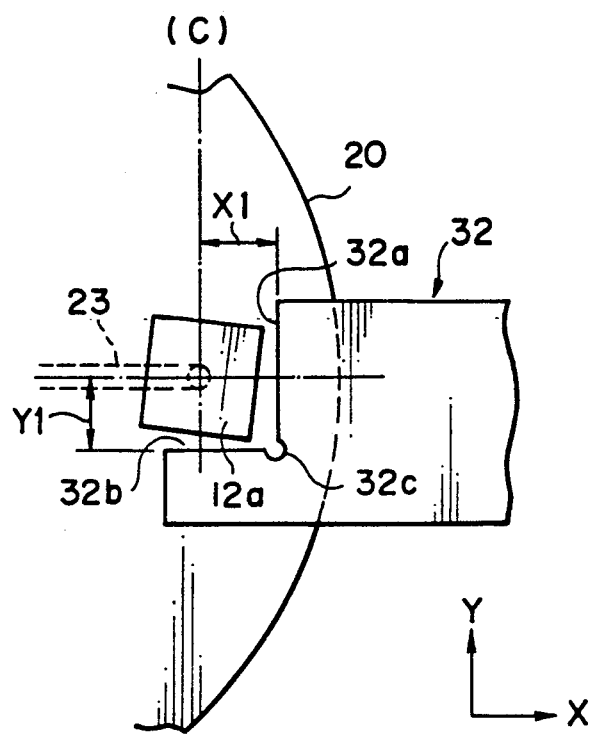
FIGS. 5 and 6 show schematic plan views of the positioning of a semiconductor chip by the apparatus of FIG. 3.

The rotary table 20 is rotated 180 degrees by the motor 28 and the chip 12a is transferred from the feeding position (B) to the ejecting position (C). After the rotation, the next chip 12a is fed to the feeding position (b) by the transfer head 11. Finally, when the positioning unit 31 is driven, the positioning plate 32 fastened at its upper face controls the position of chip 12a according to the previously established program. As shown in FIG. 5, the position of a chip 12a is adjusted by the positioning part 32a when that part moves in the X direction and the chip is adjusted by the positioning part 32b when that part moves in the Y direction.

Figure 6:
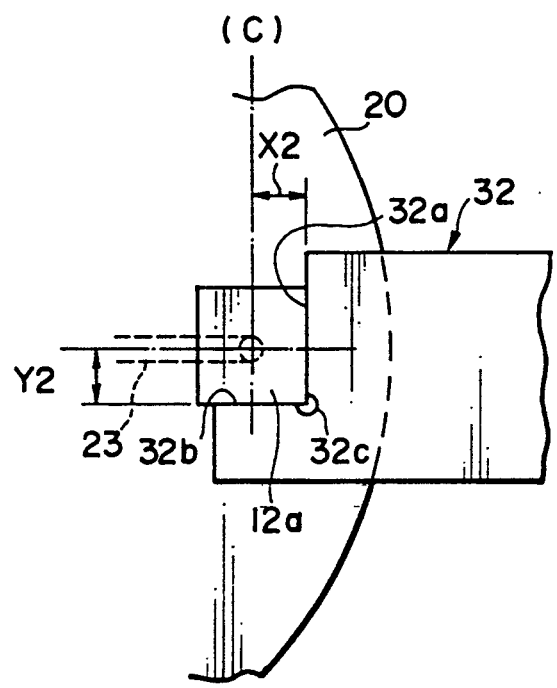

As shown in FIG. 5, the position of the chip 12a of the table 20 slips slightly at the ejecting position (C) because of the movement induced by cutting from the semiconductor wafer, lifting by the transfer head 13, and so on. Therefore, the positioning part 32a and the positioning part 32b of the positioning plate 32 are set up at X1, which is slightly larger than the chip 12a in the X direction, and at Y1, which is slightly larger than the chip 12a in the Y direction, respectively, as an original position. Next, when the controller is driven, the X direction table 31a shown in FIGS. 2 and 3 is transferred in the X direction. The positioning part 32a contacts and moves the chip 12a from the position X1 to the position X2 at the end face of chip 12a with a slight rubbing on the upper face of the rotary table 20, adjusting the position of the chip 12a as shown in FIG. 6. Similarly, the Y direction table 31b shown in FIGS. 2 and 3 is driven in the Y direction and the positioning part 32b contacts and moves the chip 12a from the position Y1 to the position Y2 at the end face of chip 12a, adjusting the position of the chip 12a as shown in FIG. 6. Thus, the positioning of the chip 12a is completed.

The chip 12a adjusted and positioned as described above is lifted by the bonding head 15 and transferred to the bonding position of the bonding apparatus.

Since the chip 12a is slightly drawn to the rotary table 20 by the vacuum equipment during the above-described adjustment, the chip 12a does not move due to its own inertia during transferral. The heating of the heat block 22 is not performed during the rotation of the rotary table 20 but only performed when the chip 12a is put on the table 20 and the rotary table 20 stops.

Only a 180 degree rotation of the rotary table is described in the above embodiment. However, the table can rotate 90 degrees or less with the angle of rotation selected depending on the number of chips put on the table at one time. Furthermore, more chips can be put on the rotary table at one time by enlarging the size of the rotary table.

We claim:

1. A method for preheating semiconductor chips comprising:
    sequentially mounting a plurality of semiconductor chips on a rotatable table;
    heating the semiconductor chips on the rotatable table, while the rotatable table is stationary, for a predetermined time; and
    sequentially ejecting the heated semiconductor chips from the rotatable table.

2. A method of preheating semiconductor chips according to claim 1 including feeding semiconductor chips apparatus.

3. A method of preheating semiconductor chips according to claim 1 including holding the semiconductor chips the rotatable table by vacuum.

4. A method of preheating semiconductor chips according to claim 1 including adjusting the positions of the semiconductor chips along two orthogonal directions before ejecting the semiconductor chips from the rotatable table.

5. An apparatus for preheating semiconductor chips comprising:
    a rotatable table;
    primary driving means for rotating said rotatable table;
    feeding means for feeding semiconductor chips to said rotatable table;
    heating means for releasably contacting said rotatable table;
    secondary driving means for driving said heating means when said rotatable table is stationary to make and release contact between said rotatable table and said heating means to heat semiconductor chips on said rotatable table while said rotatable table is stationary; and
    ejecting means for ejecting the heated semiconductor chips from said rotatable table.

6. An apparatus for preheating semiconductor chips according to claim 5 including means for applying vacuum to the semiconductor chips to hold the semiconductor chips on the rotatable table.

7. An apparatus for preheating semiconductor chips according to claim 5 comprising adjusting means for moving semiconductor chips mounted on the rotatable table along two orthogonal directions to adjust the positions of the semiconductor chips.

8. An apparatus for preheating semiconductor chips according to claim 5 comprising a semiconductor chip bonding apparatus to which ejected semiconductor chips are fed.

* * * * *

UNITED STATES PATENT AND TRADEMARK OFFICE
CERTIFICATE OF CORRECTION

PATENT NO. : 5,009,590

DATED : April 23, 1991

INVENTOR(S) : Mitarai et al

It is certified that error appears in the above-identified patent and that said Letters Patent is hereby corrected as shown below:

On the title page, after "U.S. PATENT DOCUMENTS" insert the following:

```
--          FOREIGN PATENT DOCUMENTS
   59-104137   6/1984    Japan
   63-114220   5/1988    Japan              --
```

Column 5, line 22, after "chips" insert --ejected form the rotatable table to a bonding--.

Signed and Sealed this

Eighth Day of December, 1992

Attest:

DOUGLAS B. COMER

Attesting Officer

Acting Commissioner of Patents and Trademarks